(12) United States Patent
Gramlich, Jr. et al.

(10) Patent No.: US 9,615,417 B2
(45) Date of Patent: Apr. 4, 2017

(54) DUAL POLARITY LED LIGHTING DEVICE

(71) Applicant: Grote Industries, LLC, Madison, IN (US)

(72) Inventors: Donald L. Gramlich, Jr., Deputy, IN (US); Timothy W. Brooks, Madison, IN (US); Martin J. Marx, Madison, IN (US); James E. Roberts, Madison, IN (US); William L. Corwin, Madison, IN (US); David W. Vinup, Rising Sun, IN (US)

(73) Assignee: Grote Industries, LLC, Madison, IN (US)

( * ) Notice: Subject to any disclaimer, the term of this patent is extended or adjusted under 35 U.S.C. 154(b) by 215 days.

(21) Appl. No.: 14/189,246

(22) Filed: Feb. 25, 2014

(65) Prior Publication Data

US 2015/0241045 A1 Aug. 27, 2015

(51) Int. Cl.
| | |
|---|---|
| *H05K 1/18* | (2006.01) |
| *H05B 33/08* | (2006.01) |
| *H01L 25/075* | (2006.01) |
| *H01L 25/16* | (2006.01) |
| *H05K 1/09* | (2006.01) |
| *H05K 3/28* | (2006.01) |
| *F21Y 101/00* | (2016.01) |

(52) U.S. Cl.
CPC ......... *H05B 33/0821* (2013.01); *H05K 1/181* (2013.01); *F21Y 2101/00* (2013.01);
(Continued)

(58) Field of Classification Search
CPC ..... F21V 23/00; F21V 23/002; H05B 33/089; H05B 33/0827; H05B 33/0821;
(Continued)

(56) References Cited

U.S. PATENT DOCUMENTS

| 7,053,560 B1 | 5/2006 | Ng |
| 2008/0079012 A1 | 4/2008 | Grote et al. |

(Continued)

FOREIGN PATENT DOCUMENTS

WO 2013026053 A1 2/2013

OTHER PUBLICATIONS

International Search Report and Written Opinion of the International Searching Authority mailed May 20, 2015 in the corresponding PCT international patent application No. PCT/US2015/15178.

(Continued)

*Primary Examiner* — Anh Mai
*Assistant Examiner* — Fatima Farokhrooz
(74) *Attorney, Agent, or Firm* — Posz Law Group, PLC

(57) ABSTRACT

A lighting device is described that includes a voltage source, a substrate, a wiring, a first light emitting diode (LED) and a second LED, a first electrical conductive element (ECE) and a second ECE, and a transparent, conductive sheet material. The wiring is formed on the substrate, and is connected to the voltage source. The first LED and the second LED are formed on the wiring. The first ECE and the second ECE are formed on the wiring. The sheet material is laminated onto the first and second LEDs and the first and second ECEs. The first and second LEDs are electrically connected in parallel and have opposite polarities. A sheet resistance exists between the first ECE and the first LED and between the second ECE and the second LED.

12 Claims, 8 Drawing Sheets

(52) U.S. Cl.
CPC ........ *H01L 25/0753* (2013.01); *H01L 25/167* (2013.01); *H01L 2924/0002* (2013.01); *H05K 1/09* (2013.01); *H05K 3/284* (2013.01); *H05K 2201/0108* (2013.01); *H05K 2201/097* (2013.01); *H05K 2201/10106* (2013.01)

(58) Field of Classification Search
CPC ................... H01L 33/405; H01L 33/46; H01L 2224/48091; H01L 2224/48247; H01L 2224/73265; H01L 25/0753; H01L 25/167; H01L 2924/0002; H05K 1/181; H05K 1/09; H05K 3/284; H05K 2201/0108; H05K 2201/097; H05K 2201/10106; F21Y 2101/02; F21Y 2101/00
See application file for complete search history.

(56) References Cited

U.S. PATENT DOCUMENTS

| | | | | |
|---|---|---|---|---|
| 2009/0085045 | A1* | 4/2009 | Marion | H01L 21/6835 257/79 |
| 2009/0212377 | A1* | 8/2009 | Vaganov | G06F 3/0338 257/415 |
| 2011/0069463 | A1* | 3/2011 | Chen | H05K 1/145 361/782 |
| 2011/0169118 | A1* | 7/2011 | Sano | H01L 27/14618 257/432 |
| 2011/0204505 | A1* | 8/2011 | Pagaila | H01L 21/568 257/686 |
| 2012/0043563 | A1 | 2/2012 | Ibbetson et al. | |
| 2013/0334627 | A1* | 12/2013 | Conti | H04R 19/005 257/416 |
| 2014/0085317 | A1* | 3/2014 | Lavery | B81B 7/0006 345/501 |
| 2014/0361710 | A1* | 12/2014 | Radermacher | F21S 2/00 315/294 |
| 2015/0049484 | A1* | 2/2015 | Preuschl | F21V 27/02 362/249.01 |

OTHER PUBLICATIONS

Running LEDs from an AC supply, LEDs Magazine (May 2006) Retrieved from: http://www.ledsmagazine.com/articles/2006/05/running-leds-from-an-ac-supply.html.

Brocklee, "120VAC Led Array," Eng-Tips Forums Messages posted to: http://www.eng-tips.com/viewthread.cfm?qid=86380 through Feb. 25, 2014.

* cited by examiner

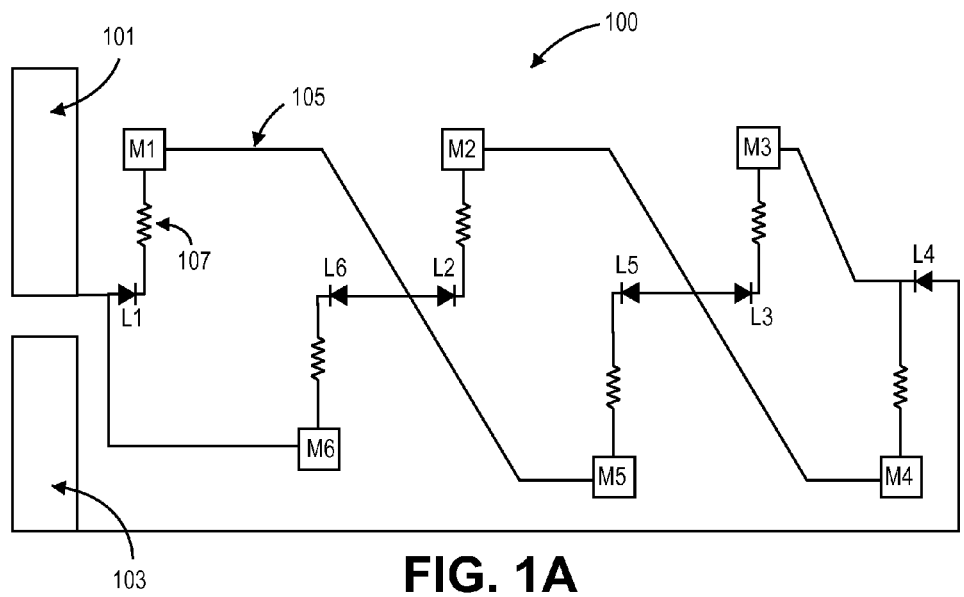
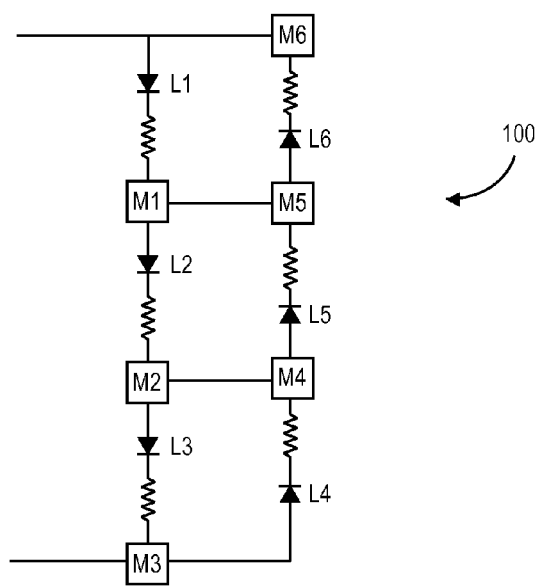
FIG. 1A
FIG. 1B

DUAL POLARITY LED LIGHTING DEVICE

TECHNICAL FIELD

The technical field relates in general to light emitting diode (LED) lighting devices. More specifically, the technical field relates to a lighting device with dual, opposite polarity LEDs connected by an optically transparent, electrically conductive material having a sheet resistivity.

BACKGROUND

Conventional LED lighting devices commonly make use of a plurality of LEDs of a single polarity in series. These conventional devices are commonly mounted on bus bars, etched circuit boards or some similar wiring to which each of the LEDs is connected. A disadvantage of these conventional devices is that the LEDs may become inoperative over a period of time from burnout due to continued usage. As well, customers must assure that polarity is correct upon connection.

Recently improved lighting devices have been designed using LEDs connected in parallel and having opposite polarities. Specifically, pairs of LEDs with opposite polarities are connected in parallel, and the pairs of LEDS are further connected in series. The LEDs connected in parallel with opposite polarities do not suffer damage during reverse voltage. This is because the first LED in each pair, operating in forward voltage, clamps the voltage to a voltage lower than the break down voltage of second LED in each pair, which has the opposite polarity.

The improved devices have an advantage over the conventional devices in that alternating currents can be used to light half of the LEDs when current flows in one direction, and light the other half of the LEDs when current flows in the other direction. The fact that LEDs can alternately illuminate extends the useful life of the lighting device. That is to say, because LEDs can alternately illuminate, LED burnout takes longer to occur.

Although alternating current LED devices are an improvement over the conventional series-connected LED devices, their application has been limited to circuit board style lighting devices. Lacking in the art is an opposite polarity, laminated, low-cost production LED lighting device that is constructed for rugged environments such as outdoor lighting. The embodiments of the present disclosure present such a device.

SUMMARY

In particular, the present disclosure presents an arrangement of inorganic LEDs connected in opposite polarities that will prevent damage during reverse voltage, the LEDs being laminated between two conductors, one of which is an optically transparent, electrically conductive material that has sheet resistivity characteristics.

The LEDs in the herein disclosed lighting device(s) are able to pass electricity from one substrate to the other using an electrical connection element (ECE). An electrical connection element is a component that transfers electricity from one substrate to another. ECEs can be made by dimpling the bottom substrate, manually placing copper tape with electrically conductive adhesive between the substrates, or automatically placing conductors or semiconductors on the bottom substrate with a die bond machine. Additionally, LED/ECE regions are electrically isolated without compromising the top substrate integrity. Succinctly put, disclosed herein are polarity neutral lighting devices, minimized in size by the use of only ECEs, inorganic LEDs, and resistors that are connected by two laminated substrates.

Accordingly, one embodiment disclosed herein provides a lighting device comprising a voltage source, a principal substrate, a conductive wiring, a first light emitting diode (LED), a second LED, a first electrical connection element (ECE), a second ECE, and a transparent, conductive sheet material. The conductive wiring is formed on the principal substrate. The first LED and the second LED are formed on the conductive wiring. The first ECE and the second ECE are also formed on the conductive wiring.

The transparent, conductive sheet material is laminated onto the first and second LEDS and the first and second ECEs. The first and second LEDs are electrically connected in parallel and have opposite polarities. Additionally, a sheet resistance is created between the first ECE and the first LED and between the second ECE and the second LED.

A second disclosed embodiment herein provides a lighting device comprising a voltage source, a principal substrate, a conductive wiring, a first set of plural, parallel light emitting diodes (LEDs), a second set of plural, parallel LEDs, a first set of one or more electrical connection elements (ECEs), a second set of one or more ECEs, and a transparent, conductive sheet material. The first and second sets of plural, parallel LEDs are formed on the conductive wiring. Additionally, the first set of one or more ECEs is formed on the conductive wiring and the second set of one or more ECEs is formed on a parallel conductive wiring.

The transparent, conductive sheet material is laminated onto all the LEDs in the first and second sets of plural, parallel LEDS and all the ECEs in the first and second sets of one or more ECEs. The first and second sets of LEDs are electrically connected in parallel. All the LEDs in the first set of plural, parallel LEDs have opposite polarities from all the LEDs in the second set of plural, parallel LEDs. When the transparent, conductive sheet material is laminated onto all the LEDs and all the ECEs, a sheet resistance is created between each ECE in the first set of one or more ECEs and the first set of plural, parallel LEDs and between each ECE in the second set of one or more ECEs and the second set of plural, parallel LEDs.

It should be noted that the purpose of the foregoing Abstract is to enable the U.S. Patent and Trademark Office and the public generally, and especially the scientists, engineers and practitioners in the art who are not familiar with patent or legal terms or phraseology, to determine quickly the nature and essence of the technical disclosure of the application. The Abstract is neither intended to define the invention of the application, which is measured by the claims, nor is it intended to be limiting as to the scope of the invention in any way.

BRIEF DESCRIPTION OF THE DRAWINGS

The accompanying figures, where like reference numerals refer to identical or functionally similar elements and which together with the detailed description below are incorporated in and form part of the specification, serve to further illustrate various exemplary embodiments and to explain various principles and advantages in accordance with the embodiments.

FIG. 1A is a plan view illustrating a physical layout of components, including LEDs and ECEs, in a first lighting device.

FIG. 1B is an electrical schematic illustrating the electrical relationships of the components, including LEDs and ECEs, in the first lighting device.

DETAILED DESCRIPTION

Figure 1C:
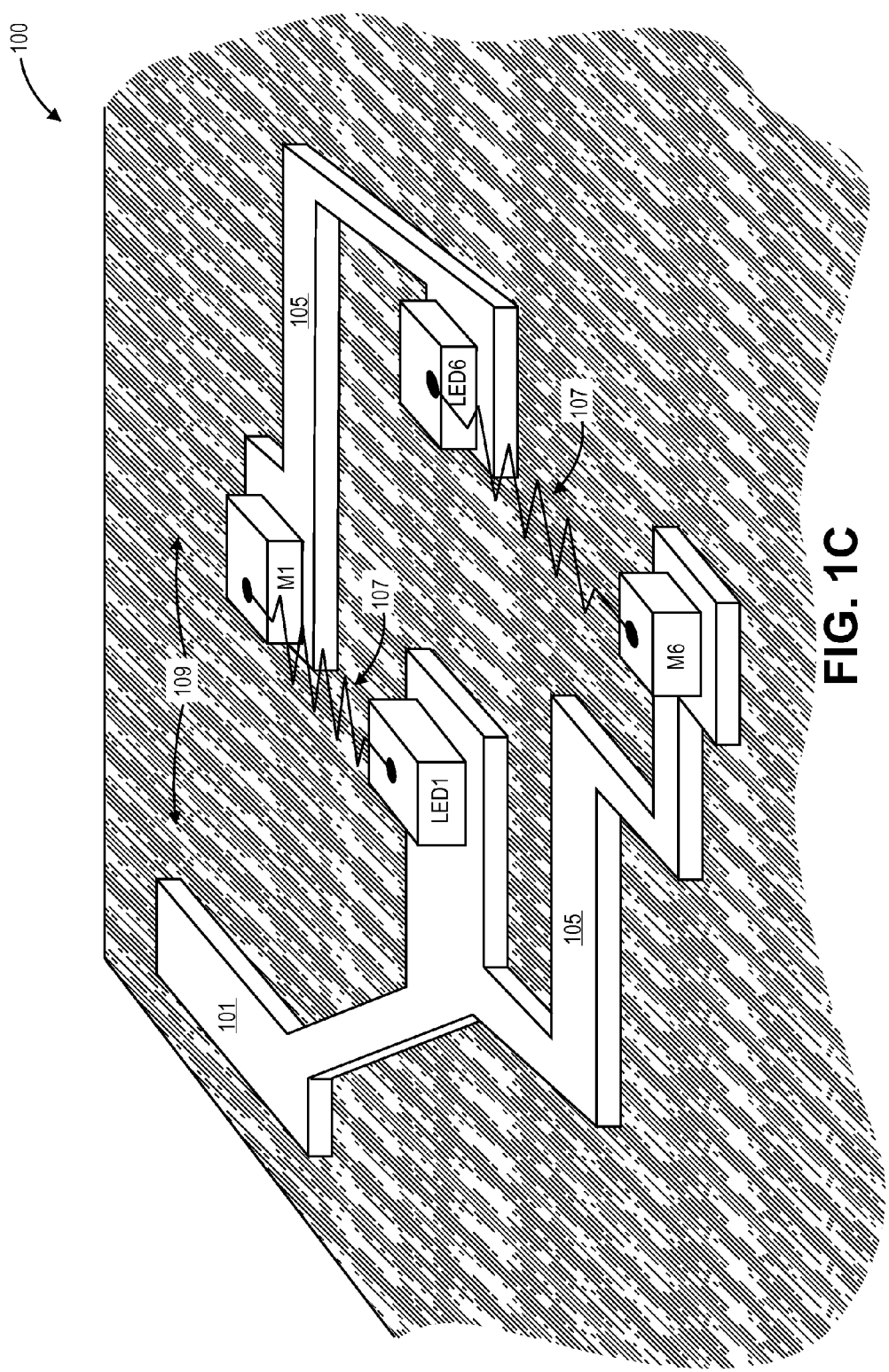
FIG. 1C is a side perspective view of a portion of the physical layout of components, including a bottom substrate, LEDs and ECEs, and sheet resistances therebetween, in the first lighting device.

In overview, the present disclosure concerns lighting devices with opposite polarity LEDs laminated (via a novel process described in more detail in U.S. Pat. No. 7,217,956, incorporated herein by reference) between two substrates, electrical connection elements (ECEs) making the necessary connections between the two substrates and the LEDs. The top substrate is characterized by a sheet resistance, and connects the LEDs, one to another and to the ECEs. The herein disclosed lighting devices can be used, for example, as automotive marker lights, as well as architectural lighting.

The instant disclosure is thus provided to further explain in an enabling fashion one or more embodiments of an inventive lighting device. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Referring now to FIG. 1A, a plan view illustrating a physical layout of components, including LEDs and ECEs, in a first lighting device 100 is discussed and described. The first lighting device 100 includes conductive metals pads 101, 103, conductive metal traces 105, LEDs L1, L2, L3, L4, L5, L6 ("L1-L6") and ECEs M1, M2, M3, M4, M5, M6 ("M1-M6"). The conductive metal pads 101, 103 are relatively large pads 101, 103 that provide a firm and solid contact with a voltage source. The metal pads 101, 103 may be formed of any well-known conductive metal that typically would be inexpensive in the manufacturing process, such as copper. However, the metal pads 101, 103 can also be formed from other conducive metals such as gold, platinum, aluminum or silver and alloys such as brass, bronze, palladium silver or aluminum alloys.

The metal pads 101, 103 are mounted on a principal substrate. The principal substrate may typically be a polyethylene naphthalate (PEN) substrate, a polyethylene terephthalate (PET) substrate, a polyimide (PEEK) substrate, or a transparent conductive polyester substrate. These substrates are chosen for their property that they can be manufactured in a continuous strip, are flexible, and are compatible with roll to roll manufacturing. In order to show the physical layout from above, and in order to keep the illustration simple, the principal substrate on which the metal pads 101, 103 rest is not shown in FIG. 1A.

The metal pads 101, 103 are integrally connected to conductive metal traces 105. It should be noted that all the solid lines (other than those lines that form the LEDs L1-L6 and ECEs M1-M6) are conductive metal traces 105. The conductive metal traces 105 are typically made of the same conductive materials that form the metal pads 101, 103. The conductive metal traces 105 are also formed on the principal substrate.

Referring now to FIG. 1C, a side perspective view of a portion of the physical layout of components, including LEDs and ECEs, in the first lighting device 100, is discussed and described. Of the two conductive, metal pads 101, 103 illustrated in FIG. 1A, the side perspective view of the first lighting device 100 illustrates only the first conductive metal pad 101. As can be clearly seen from the side perspective view, the metal pad 101 is mounted on the principal substrate 109.

As can also be seen in FIG. 1C, the conductive metal traces 105 are also mounted on the principal substrate 109. FIG. 1C further illustrates that the LED L1 is directly connected with ECE M6 through a conductive trace 105. As well, the LED L6 is directly connected with ECE M6 through a conductive trace 105.

As mentioned above, an inventive feature of the present disclosure is that LEDs of opposite polarities are laminated between two substrates which are a bottom and a top substrate. In FIG. 1C, it is clear that LED 1 and LED 6 rest on the conductive traces 105 that are further formed on the bottom, principal substrate 109. It should be noted that there is a thickness associated with the bottom, principal substrate 109. However, it is not shown in FIG. 1C (as well as in FIG. 1D) for ease of illustration. The top substrate is also not illustrated in FIG. 1C so that the components mounted on the principal substrate 109 are more easily seen.

Figure 1D:
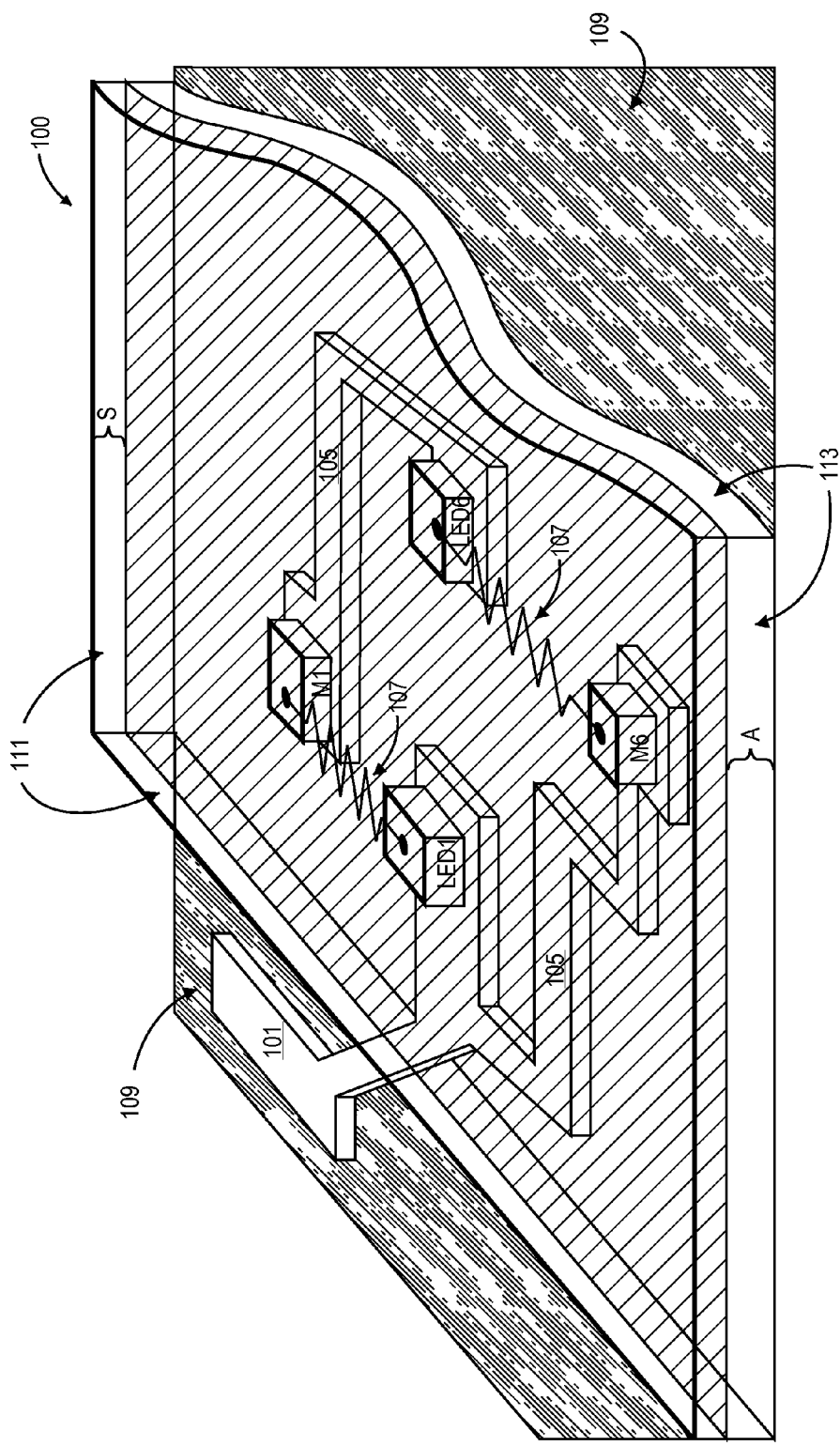
FIG. 1D is the side perspective view of the first lighting device illustrated in FIG. 1C, but also including a top substrate.

FIG. 1D, however, provides the side perspective view of the first lighting device 100 illustrated in FIG. 1C, but also including a top substrate 111 that is a transparent material. More specifically, the top substrate 111 is coated with an electrically conductive, optically clear material with sheet resistivity characteristics.

The top substrate 111 is formed on an adhesive layer 113. The adhesive layer 113 exists substantially in all areas between the principle substrate 109 and the top substrate 111 that are not otherwise occupied by LEDs 1 and 6 and MCEs 1 and 6. The adhesive layer 113 servers to adhere the principal substrate 109, the top substrate 111, and any LEDs and MCEs connecting the principal substrate 109 to the top substrate 111.

The adhesive layer 113 is shown with a thickness "A" and the top substrate 111 is shown with a thickness "S." It should be noted that, however, that FIG. 1D is not drawn to scale. In practice, the thickness A of the adhesive layer after lamination will be equal to or less than the thickness of the LED. The thickness S of the top substrate 111 is typically in a range between 0.001 inches and 0.100 inches. That is to say, 0.001 inches≤S≤0.100 inches.

The hatching provided in FIG. 1D illustrates the bottom side of the top substrate 111. This bottom side rests on the adhesive layer, and also contacts each ECE and LED in the first lighting device 100. In FIG. 1D, the contact between the bottom side of the top substrate 111 and LED L1, ECE M1, LED L6, and ECE M6 is shown by darken bolded lines at the contact points of these components. The hatching is the location of the transparent, conductive sheet material. The top substrate 111 thus serves to connect LEDs with MCEs, and creates sheet resistance 107 therebetween.

One typical coating compound on the top substrate 111 is indium tin oxide (ITO). Other zinc oxides may also be used. Another possible resistive substance to coat onto the top substrate 111 is carbon nanotubes. These are just examples, and one or ordinary skill in the art would understand that any electrically conductive, optically clear material can be used to transfer electricity across a clear substrate to the inorganic LEDs.

As can be seen from FIG. 1D, the metal pad 101 is disposed outside of a sandwich formed by the principal bottom substrate 109, the top substrate 111, and an adhesive layer 113. The metal pad 101 thus may operate as a lead. The metal pad 101 can connect the first lighting device 100 to other lighting devices.

It should be noted that portions of FIG. 1D may appear to demonstrate that a laminated portion of the lighting device 100 including the principal bottom substrate 109, the adhesive layer 113, and the top substrate 111 have a box like shape. However, this is not actually the case. The entire laminated portion may extend rightward to include all the LEDs and MCEs in the lighting device 100 that are not shown in FIG. 1D. Additionally, although it may appear that there is a cut-off of the principal bottom substrate 109, the adhesive layer 113, and the top sub substrate 111 in a farther away direction from the viewer (toward the top of page in the drawing), this again is not necessarily the case. FIG. 1D is simply a cut-away to show the components and structure of the lighting device 100 more clearly. However, nothing regarding actual scale, exact layout, and exact size should be inferred from the drawing.

As seen in FIGS. 1A, 1B, 1C, and 1D, and as indicated above, a sheet resistance 107 exists between ECE M1 and LED L1 and between ECE M6 and LED L6. It should be noted that each resistance illustrated in FIG. 1A, as well as in the remainder of the drawings, is a sheet resistance, and not an actual resistor, between the top substrate and an LED. The top substrate thus acts to connect the LEDs one to another. Because of the sheet resistance of the top substrate, the components of FIG. 1A may be arranged in manner such that there are no cross overs in the metal traces 105.

In FIGS. 1A and 1B, the LEDs L1-L6 are conventional inorganic LEDs, each including an anode die bonded to the copper 105 on the bottom substrate 109, and a cathode connected to the optically transparent, electrically conductive top substrate 111. It should be noted that with a ⅛" pitch for the LED L1-L6, the entire circuit in FIG. 1A can be contained within an inch. As discussed further below, the LEDs L1-L6 are connected such that half of the LEDs have opposite polarities from the others. As with prior circuit board arrangements, the LEDs of one polarity clamp the voltage to a level that is lower than a breakdown voltage of the LEDs of the opposite polarity.

The ECEs M1-M6 are used to move current from the top substrate 111 discussed above to the LEDs L1-L6 such that a circuit is created. As described above, exemplary ECEs may include copper tape with electrically conductive adhesive, dimples in the bottom copper conductor, or a diced metal conductor. However, these are just examples and it should be understood that any electrically conductive element can be used to move current from one side of the lamination to the other.

Referring now to FIG. 1B, an electrical schematic illustrating the electrical relationships of the components, including LEDs and ECEs, in the first lighting device 100 is discussed and described. Stated another way, FIG. 1B illustrates the logical arrangement of LEDs L1-L6 and ECEs M1-M6 illustrated in FIG. 1A. The arrangement of the LEDs L1-L6 in FIG. 1B are such that L1 and L6 are connected in parallel, L2 and L5 are connected in parallel, and L3 and L4 are connected in parallel. FIG. 1B therefore further demonstrates that three pairs of opposite polarity LEDs are connected in series.

As can be seen, the LEDs L1, L2, L3 are all of the same polarity while LEDs L4, L5, L6 are of opposite polarity to LEDs L1, L2, L3. Thus, regardless of the direction of current in the circuit shown in FIG. 1B, only three of the LEDs will be illuminated at any given time. Given the arrangement of parallel pairs of LEDS in series, either LEDs L1, L2, and L3 are illuminated or LEDs L4, L5, and L6 are illuminated. It should be noted that a lighting device need not have any more LEDs than a single pair of opposite polarity LEDS connected in parallel. Of course, such a device would very small.

Turning back to FIGS. 1A and 1C, it should be noted that one characteristic of the electrically conductive, optically clear top substrate is that current will flow between any two conductors that contact the substrate. Thus, as shown if 12V were for example applied to the circuit, current would flow between LED L1 and ECE M1. However, since the substrate is connected to all the LEDs L1-L6 and all the ECEs M1-M6, some current would also flow between LED L1 and ECE M6, for example. In order to direct current in a manner as logically desired, sheet resistivity must be interrupted.

Figure 2A:
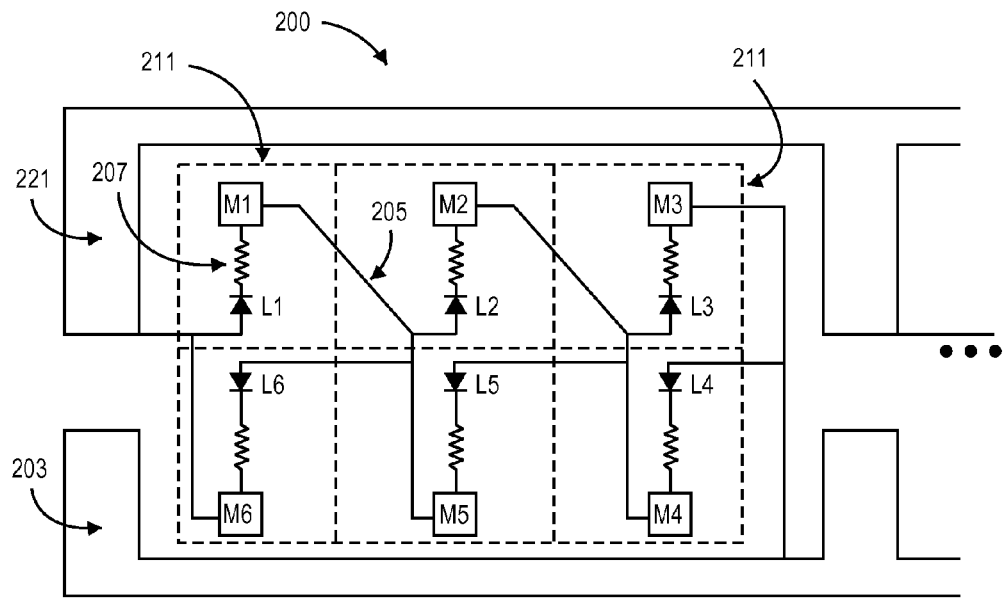
FIG. 2A is a plan view illustrating the physical layout of components, including LEDs and ECEs, in a second lighting device, and also including isolation regions.

Referring now to FIG. 2A, a plan view illustrating the physical layout of components, including LEDs and ECEs, of a second lighting device 200 which includes isolation regions, is discussed and described. In FIG. 2A, the second lighting device 200 includes conductive metal pads 201, 203, conductive metal traces 205, LEDs L1-L6, ECEs M1-M6, and isolation regions 211. The second lighting device 200 also includes the top substrate. The components of the second device, other than the isolation regions 211, have the same characteristics of those described above with respect to the first lighting device 100.

Thus, the isolation regions 211 of the second lighting device 200 provide the mechanism for ensuring sheet resistivity 207 is interrupted. The isolation regions 211 are formed by removing portions of the electrically conductive, optically clear material that forms the top substrate. The top substrate has been removed in the pattern shown by the dotted lines in FIG. 2A.

One technology that can be used to remove the portions of the top substrate forming the isolation regions 211 is laser scribing. In laser scribing, a laser is used to remove portions of the second substrate by burning away the optically transparent, electrically conductive coating. Other technologies for removing portions of the top substrate include only printing the coating where is it needed, masking areas where coating is not desired, and die cutting the top substrate and coating.

Figure 2B:
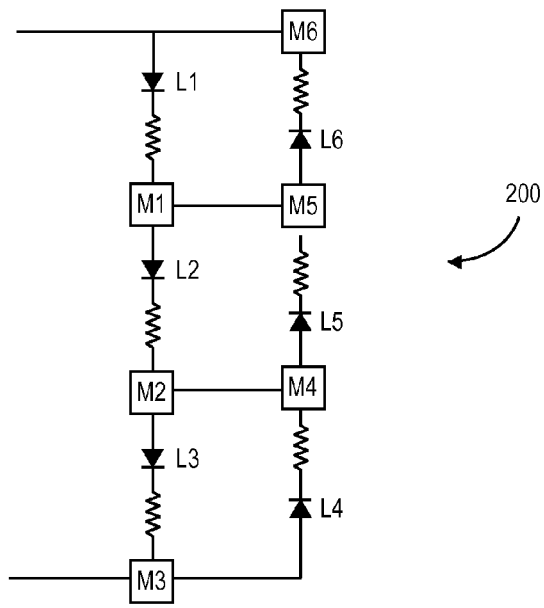
FIG. 2B is an electrical schematic illustrating the electrical relationships of the components, including LEDs and ECEs, of the second lighting device that also includes isolation regions.

Referring now to FIG. 2B, an electrical schematic illustrating the electrical relationships of the components, including LEDs and ECEs, of the second lighting device 200 200 that also includes isolation regions. Similar to FIG. 1B, FIG. 2B provides the logical arrangement of LEDs L1-L6 and ECEs M1-M6 illustrated in FIG. 2A. What is striking about the logical arrangement of the LEDs and ECEs in FIG. 2A is that it is the exact same as the arrangements of LEDs and ECEs in FIG. 1A.

What is inferred from this statement is that the physical relationship of components in FIG. 1A and the physical relationship of components in FIG. 2A provide the same electrical relationship among the components. A closer inspection of the conductive metal traces 205 in FIG. 2A reveals that the physical connections of the second lighting device 200 200 are essentially the same, except that certain components are translated to an extent that the isolation regions 211 can be easily formed through one of the above described removal processes. Thus, the behavior characteristics described above with respect to the components of the first light device are the same with respect to the second light device, with the further advantage that stray resistances are eliminated.

More specifically, in the lighting device illustrated by FIG. 2A, if the metal pad 201 has been set to +12V, and the bottom metal pad 203 is grounded, current will flow through L1, M1, L2, M2, L3, and M3 to ground. Correspondingly, LEDs L1, L2 and L3 will be illuminated. LEDSs L4, L5, L6 will not be illuminated, as they will be reverse biased. It should be noted that LEDs L4, L5 and L6 are not damaged, as the reverse voltage will be less than the breakdown voltage limit of 5V clamped by the forward bias LEDs L1, L2, and L3.

On the other hand, if the metal pad 203 has been set to a +12V, and the top metal pad 201 is grounded, current will flow through L4, M4, L5, M5, L6 and M6 to ground. LEDs L4, L5 and L6 will of course be illuminated, while LEDs L1, L2 and L3 will not be illuminated. LEDs L1, L2 and L3 will be reverse biased. Nonetheless, LEDs L1, L2 and L3 will not be damaged as the reverse voltage will be less than the breakdown voltage limit of 5V clamped by the forward bias LEDs L4, L5, and L6.

In the circuits above, if the electrical connection to any one ECE, LED or the top substrate is lost, the electrical flow to all of the LEDs will stop. Of course, there would then be no illumination. It is therefore desirable to have more than one LED in parallel as a redundancy. It may be desirable to also have more than one ECE connecting the plural LEDs to the top substrate.

It should also be noted that in general, forming isolation regions where the pattern of removal of the top substrate is a straight line is also desirable. This is because removing the top substrate in a straight line generally easier in manufacturing. This is true both when the isolations regions are formed by laser scribing or by some other process.

Figure 3A:
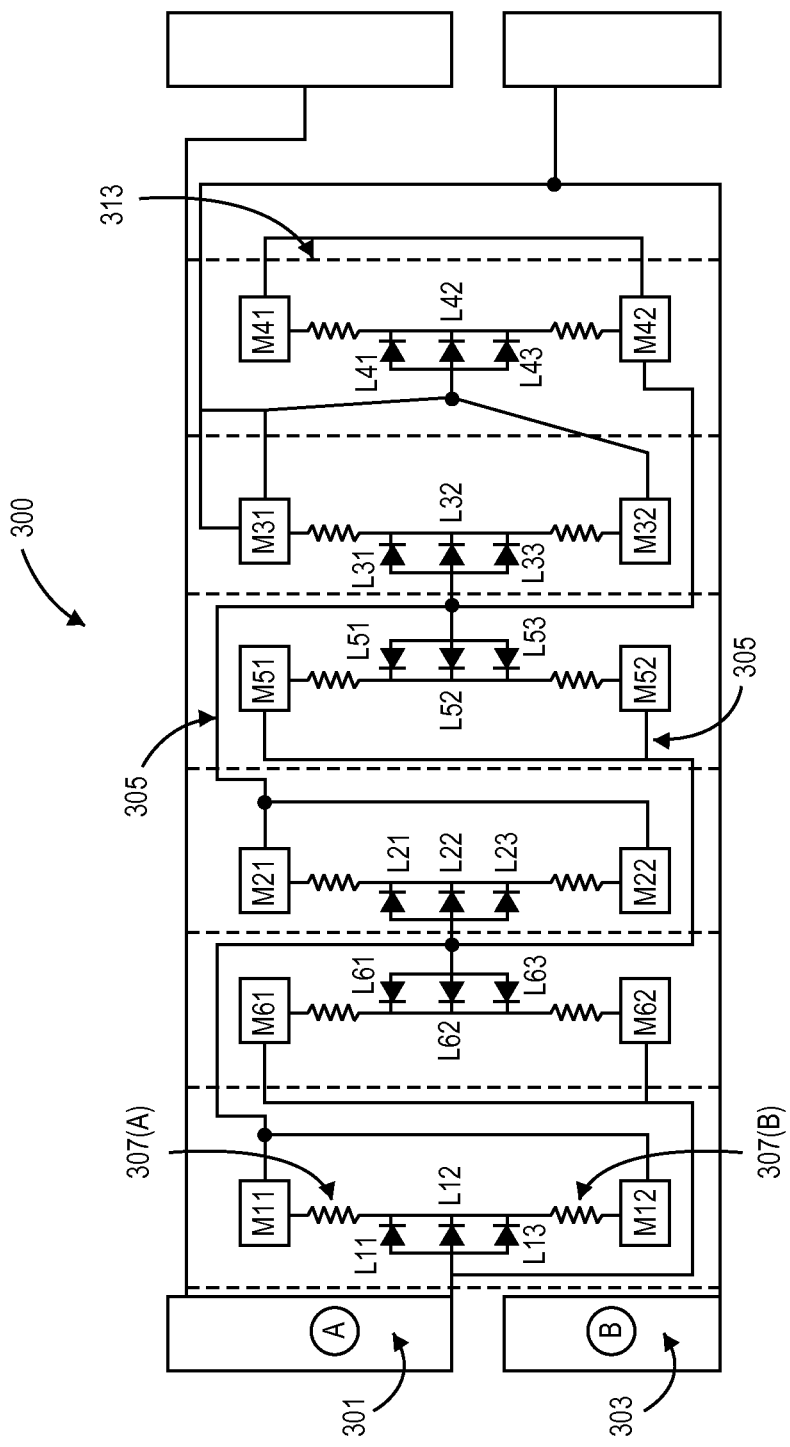
FIG. 3A is a plan view illustrating the physical layout of components, including sets of plural, parallel LEDs and sets of one or more ECEs, in a third lighting device.

Referring now to FIG. 3A, a plan view of a physical layout of components, including sets of plural, parallel LEDs and sets of one or more ECEs, in a third lighting device 300, is now discussed and described. The third lighting device 300 includes conductive metals pads 301, 303 and conductive metal traces 305. The third lighting device 300 also includes sets of plural, parallel LEDs [L11, L12, L13], [L21, L22, L23], [L31, L32, L33], [L41, 42, 43], [L51, L52, L53], [L61, 62, 63]. The third lighting device 300 further includes sets of one or more ECEs [M11, M12], [M21, M22], [M31, M32], [M41, M42], [M51, M52], [M61, M62]. Not shown specifically in FIG. 3A is the bottom, principal substrate and the optically clear material with sheet resistivity characteristics that forms the top substrate.

The LEDs in each set of LEDs are connected in parallel with the other. Thus L11, L12, and L13 in the set of [L11, L12, L13] are connected in parallel; L21, L22, and L23 in the set of [L21, L22, L23] are connected in parallel; L31, L32, and L33 in the set of [L31, L32, L33] are connected in parallel, and so on. In each set of three, parallel LEDs, if one LED burns out, the remaining functional LEDs are illuminated with a higher intensity. Thus in FIG. 3A there is a triple redundancy of LEDs to improve reliability.

In FIG. 3A, there is an ECE on each side of each set of plural, parallel LEDs that are connected via a conductor on the bottom substrate. Thus, ECEs M11 and M12 are connected in parallel with each other, and in series with the set of [L11, L12, L13]; M21 and M22 are connected in parallel with each other, and in series with the set of [L21, L22, L23]; M31 and M32 are connected in parallel with each other, and in series with the set of [L31, L32, L33], and so on. The presence of an ECE on each side of each set of plural LEDs results in a first sheet resistance 307(A) and a second sheet resistance, 307(B) between the set of plural, parallel LEDs and the ECEs on each side of each set of plural, parallel LEDs.

Dividing the sheet resistor into to separate sheet resistors has been shown to increase the amount of current each set of plural, parallel LEDs can handle. Thus there is an increase in light output, as well as a redundancy in ECE connectivity. It should be noted that while redundancy in ECE connectivity is beneficial, the redundancy in LED operation is of higher importance in that if illumination does not occur, the purpose of the lighting device is defeated.

As mentioned above with respect to FIG. 2A, it is important to eliminate stray sheet resistivity. In FIG. 3A isolation regions are formed by removing the top substrate along the straight dotted lines 313. Thus each set of plural, parallels LEDs formed in series with parallel ECEs is isolated from every other set of plural, parallel LEDs formed in series with parallel ECEs.

It should be noted that using isolation regions where the top substrate has been removed along straight lines (such as dotted lines 313) provides advantages. Specifically, removing the top substrate in a straight line allows for a kiss-cut die cutting operation instead of a laser scribing operation. This can reduce manufacturing costs and save time as is known in the art.

Figure 3B:
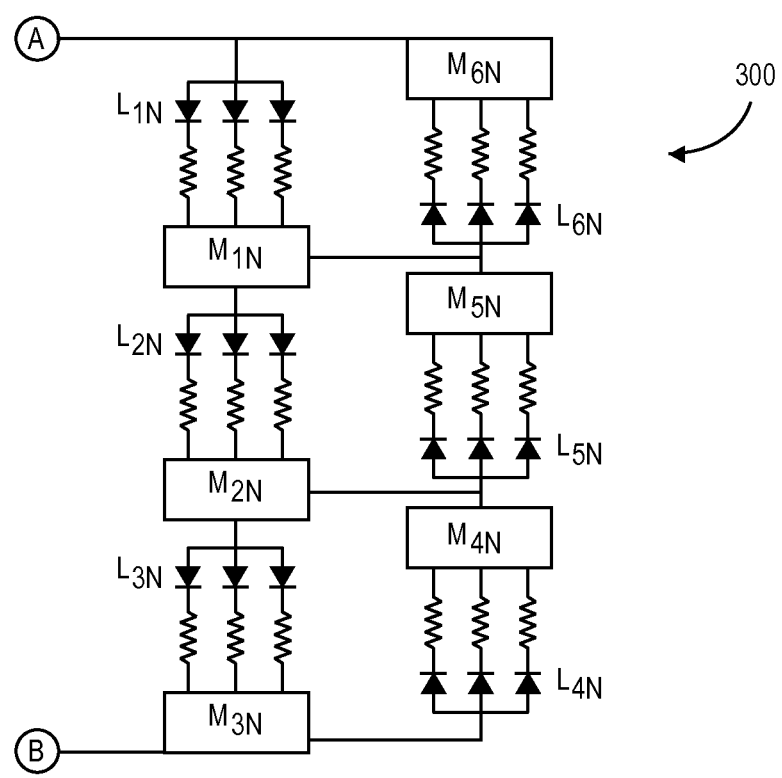
FIG. 3B is an electrical schematic illustrating the electrical relationships of the components, including sets of plural, parallel LEDs and sets of one or more ECEs, in the third lighting device.

Referring now to FIG. 3B, an electrical schematic illustrating the electrical relationships of the components, including sets of plural, parallel LEDs and sets of one or more ECEs, in the third lighting device 300 is discussed and described. It should be noted that the notation of the sets of plural, parallel LEDs and the sets of one or more parallel ECEs is slightly different than in FIG. 3A. Specifically sets of plural, parallel LEDs are referred to as L1N, L2N, L3N, L4N, L5N, and L6N. This reflect the fact that there are six sets of parallel LEDs in the drawings but that the actual number of redundant LEDs may change. Thus in FIGS. 3A and 3B, there are three LEDs in parallel in each set, but there is no reason why there could not be two, four, five or any other numbers of parallel LEDs in each set.

The same is true with respect to the sets of one or more ECEs. The sets of one or more ECEs in FIG. 3B are labeled as M1N, M2N, M3N, M4N, M5N, M6N where there are six sets of one or more ECEs. Hereto, N represents the number of parallel ECEs in each set of one or more ECEs. Thus in FIG. 3B the individual LEDs and ECEs are not labeled but only the sets of LEDs and ECEs.

Thus in FIG. 3B, the sets of plural, parallel LEDs [L11, L12, L13] is simply L1N; the set of plural, parallel LEDs [L21, L22, L23] is simply L2N; the set of plural, parallel LEDs [L31, L32, L33] is simply L3N, and so on, where N=3. In FIG. 3B, the set of one or more ECEs [M11, M12] is simply M1N; the set of one or more ECEs [M21, M22] is simply M2N; the set of one or more ECEs [M31, M32] is simply M3N, and so on. It should be noted that in FIG. 3B, N=3 for the plural, parallel LEDs, and N=2 for the ECEs. N may of course be any number of parallel LEDs or ECEs.

The arrangement of sets of LEDs in FIG. 3B then is such that sets L1N and L6N are connected in parallel; sets L2N and L5N are connected in parallel; and sets L3N and L4N are connected in parallel. Further, the parallel sets of L1N/L6N, L2N/L5N, and L3N/L4N are connected in series. Further all of the LEDs in the sets of plural, parallel LEDs L1N, L2N, L3N have the same polarity, and are of different polarity from all the LEDs in the sets of plural, parallel LEDs L6N, L5N, L4N. Thus regardless of the direction of current in the circuit show in FIG. 3B, only three sets of the plural, parallel LEDs will be illuminated at any given time.

More specifically, in the lighting device illustrated in FIG. 3B, if the metal pad 301 (A) has been set to a +12V, and the bottom pad 303 (B) is grounded, current will flow through plural, parallel LED sets L1N, L2N, and L3N to ground. Correspondingly, plural, parallel LED sets L1N, L2N and L3N will illuminate. Plural, parallel LED sets L4N, L5N, L6N will not illuminate, as they will be reverse biased. It should be noted that LEDs in the plural, parallel LED sets L4N, L5N, L6N will not be damaged as the voltage will be clamped by the LED sets in forward bias to a level that below the break down voltage of 5V.

On the other hand, in the lighting device illustrated in FIG. 3B, if the metal pad 303 (B) has been set to a +12V, and the top metal pad 301 (A) is grounded, current will flow through plural, parallel LED sets L4N, L5N, and L6N to ground. Correspondingly, plural, parallel LED sets L4N, L5N and L6N will be illuminated. Plural, parallel LED sets L1N, L2N, L3N will not be illuminated, as they will be reverse biased. Of course the LEDs in the plural, parallel LED sets L1N, L2N, L3N will not be damaged as the voltage will be clamped by the LED sets in forward bias to a level that below the break down voltage of 5V.

Figure 4A:
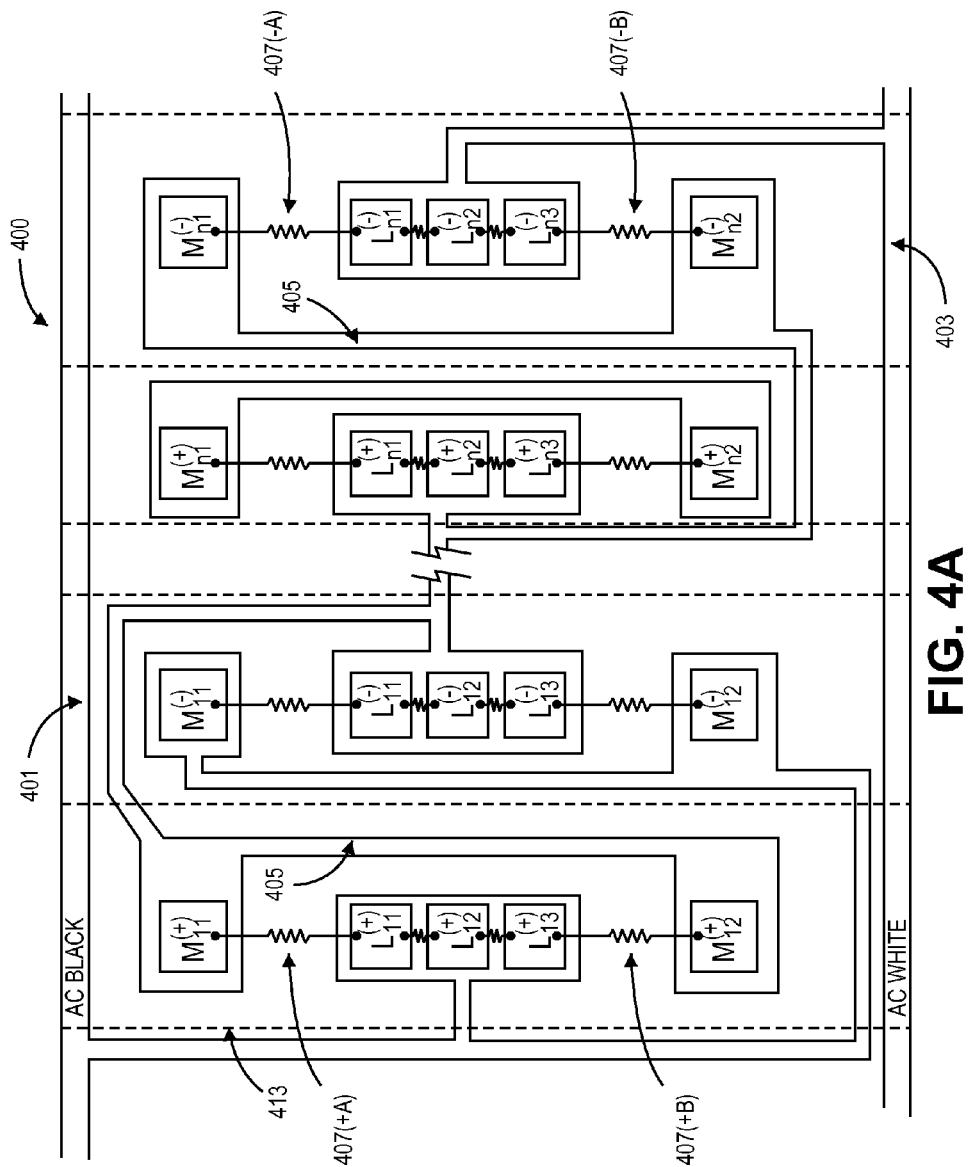
FIG. 4A is a plan view illustrating a condensed physical layout of components, including sets of plural, parallel LEDs and sets of one or more ECEs, for an alternating current (AC), high-voltage fourth lighting device.

Referring now to FIG. 4A, a plan view illustrating a condensed physical layout of components, including sets of plural, parallel LEDs and sets of one or more ECEs, for an alternating current (AC), high-voltage fourth lighting device 400 is discussed and described. The previously discussed lighting devices, including the third lighting device 300, have all generally been designed for operation with a +12V source. The fourth lighting device 400 maintains the same basic circuit layout as provided by the third lighting device 300, but the sets of plural, parallel LEDs and sets of one or more ECEs are designed to be repeated to achieve a light that will operate on a higher voltage, AC system, such as a 120 VAC system.

Figure 4B:
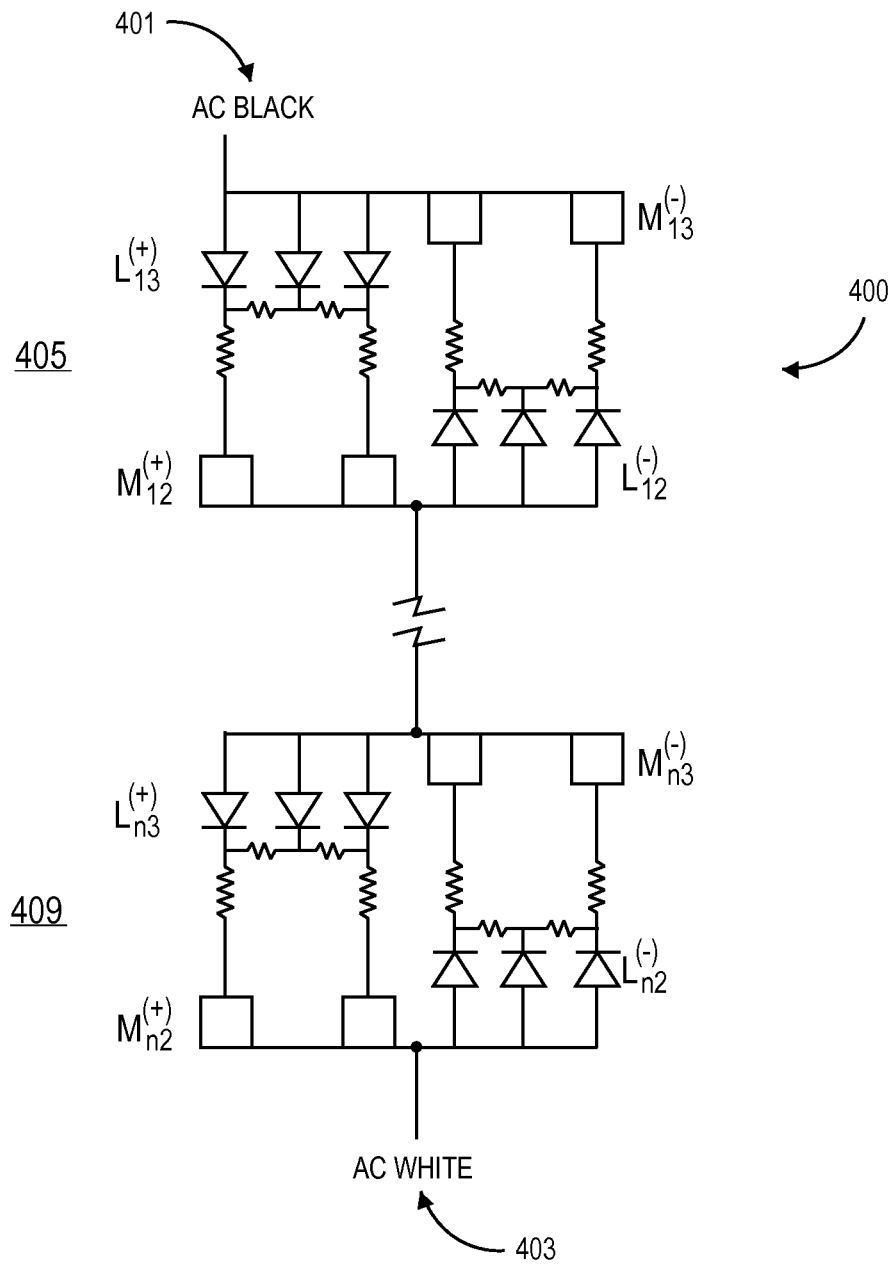
FIG. 4B is an electrical schematic illustrating the electrical relationships of the components, including sets of plural, parallel LEDs and sets of one or more ECEs, in the AC, high-voltage fourth lighting device.

It should be noted that in this discussion of FIGS. 4A and 4B, the "||" sign is used as an operator to indicate that the components on either side of the "||" sign are connected in parallel. In FIG. 4A, the traces 405 are shown with greater width, such that the LEDs and ECEs can be seen as disposed on the traces 405. All resistors symbols in FIG. 4A again represent a sheet resistance. It can be see that there is even a minor sheet resistance between LEDs in a set of parallel LEDs such as in $L^{(+)}_{11}\|L^{(+)}_{12}\|L^{(+)}_{13}$. Lastly isolation regions are again shown by FIG. 4A using dotted lines.

In considering the fourth lighting device 400, a segment is defined as a set of plural, parallel LEDs $LL^{(+)}_{ix}$, a set of one or more ECEs $M^{(+)}_{ix}$, a set of plural, parallel LEDs $L^{(+)}_{ix}$, and a set of one or more ECEs $M^{(-)}_{ix}$. Segments end and begin at the ⵂ indicators. In the above symbols, the "i" represents the "i"th segment from the total number of segments "n." The "x" represents the total number of parallel LEDs in a set of plural, parallel LEDs or the total number of ECEs in a set of one more ECEs. Thus for example in FIG. 4A, "x" for LEDs is "3", which indicates that there are 3 LEDs in each set of plural, parallel LEDs. Similarly "x" for ECEs in FIG. 4A is 2, which indicates that there are 2 ECEs in each set of one or more ECEs.

In the definition of a segment, the superscript (+) indicates the LEDs and ECEs that will conduct when the bus 401 "AC Black" is positive with respect to the bus 403 "AC White." The superscript (−) indicates the LEDs and ECEs that will conduct when the bus 401 "AC Black" is negative with respect to the bus 403 "AC White." Further, for remainder of this discussion the positive cycle will be that cycle of the AC waveform that the bus "AC Black" is positive with respect to "AC White," and the negative cycle will be that of the AC waveform where the bus "AC Black" is negative with respect to "AC White."

In the positive cycle, current will flow through the numbered segments as follows:

(1) $L^{(+)}_{11}\|L^{(+)}_{12}\|L^{(+)}_{13}$ and through the sheet resistances 407(+A), 407(+B), for example, and through the electrical conducting elements $M^{(+)}_{11}$ and $M^{(+)}_{12}$;

(2) $L^{(+)}_{21}\|L^{(+)}_{22}\|L^{(+)}_{23}$ and through the corresponding sheet resistances and through the electrical conducting elements $M^{(+)}_{21}$ and $M^{(+)}_{22}$;

(i) $L^{(+)}_{i1}\|L^{(+)}_{i2}\|L^{(+)}_{i3}$ and through the corresponding sheet resistances and through the electrical conducting elements $M^{(+)}_{i1}$ and $M^{(+)}_{i2}$;

(i+1) $L^{(+)}_{(i+1)1}\|L^{(+)}_{(i+1)2}\|L^{(+)}_{(i+1)3}$ and through the corresponding sheet resistances and through the electrical conducting elements $M^{(+)}_{(i+1)1}$ and $M^{(+)}_{(i+1)2}$; and (n) $L^{(+)}_{n1}\|L^{(+)}_{n2}\|L^{(+)}_{n3}$ and through the corresponding sheet resistances and through the electrical conducting elements $M^{(+)}_{n1}$ and $M^{(+)}_{n2}$.

In the negative cycle, the current will flow through the numbered segments as follows:

(n) $L^{(-)}_{n1}\|L^{(-)}_{n2}\|L^{(-)}_{n3}$ and through the sheet resistances 407(-A), 407(-B), for example, and through the electrical conducting elements $M^{(-)}_{n1}$ & $M^{(-)}_{n2}$.

(i−1) $L^{(-)}_{(i-1)1}\|L^{(-)}_{(i-1)2}\|L^{(-)}_{(i-1)3}$ and through the corresponding sheet resistances and through the electrical conducting elements $M^{(-)}_{(i-1)1}$ & $M^{(-)}_{(i-1)2}$;

(i) $L^{(-)}_{i1}\|L^{(-)}_{i2}\|L^{(-)}_{i3}$ and through the corresponding sheet resistances and through the electrical conducting elements $M^{(-)}_{i1}$ & $M^{(-)}_{i2}$;

(2) $L^{(-)}_{21}\|L^{(-)}_{22}\|L^{(-)}_{23}$ and through the corresponding sheet resistances and through the electrical conducting elements $M^{(-)}_{21}$ & $M^{(-)}_{22}$; and (l) $L^{(+)}_{11}\|L^{(-)}_{12}\|L^{(-)}_{13}$ and through the corresponding sheet resistances and through the electrical conducting elements $M^{(-)}_{11}$ & $M^{(-)}_{2}$;

In FIG. 4A during the positive cycle, the forward voltage characteristics of the LEDs $L^{(+)}_{i1}\|L^{(+)}_{i2}\|L^{(+)}_{i3}$ will protect the reverse biased LEDs $L^{(-)}_{i1}\|L^{(-)}_{i2}\|L^{(-)}_{i3}$. During the negative cycle, the forward voltage characteristics of LED's $L^{(+)}_{i1}\|L^{(-)}_{i2}\|L^{(-)}_{i3}$ will protect the reverse biased LED's $L^{(+)}_{i1}\|L^{(+)}_{i2}\|L^{(-)}_{i3}$. As discussed above, the forward bias LEDs clamp the voltage to a voltage lower than the breakdown voltage of the LEDs in reverse bias.

Sheet resistance $R_{si}$ in the above current flow example is assumed to be equal throughout. Current practice and experience with the fourth lighting device 400 demonstrates that 3 segments of parallel, opposite polarity sets of LEDs can successfully operate in 12V-16V system without breakdown (i.e., voltage in each segment will be less than 5V). Extending the arithmetic, approximately 30 segments of parallel, opposite polarity sets of LEDs would be necessary in a 120 VAC system. It should be noted, however, that the peak voltage in a VAC system is the United States is slightly less than 180 $VAC_{p-p}$. Thus, to restrict each segment to less than $5V_{peak}$, a total of 36 (180V/5V) segments should used in the 120 VAC system.

The dimensions of a segment (including two sets of opposite polarity, parallel LEDs) as illustrated in FIG. 4A is about 0.25 inches or 7 mm. Thus in a 120 VAC system, such as light strip, 36 segments would require less than 10 inches or 25 cm. It should be noted that the electrical pads 403 AC White and 401 AC Black can be connected to additional VAC systems. A roll of repeating 120 VAC lights systems can easily be formed. Lastly, although 120 VAC systems are quite common, the number of segments in a lighting strip can be increased or decreased to accommodate an AC system of any particular voltage.

Referring now to FIG. 4B, an electrical schematic illustrating the electrical relationships of the components, including sets of plural, parallel LEDs and sets of one or more ECEs in the AC, high-voltage fourth lighting device 400 is discussed and described. FIG. 4B shows the electrical representation of first segment 405 and the last segment 409 in a series of segments in an ACV lighting system. There may or may not be intervening segments between segments 405 and 409, however in large voltage lighting strip (such as a 120 VAC system) it can be assumed there will be a substantial number of segments that do intervene.

It should be note that sets of plural, parallel LEDs are given by the single descriptor $L^{(+/-)}_{i3}$ where "i" extends from 1 to "n" with "n" being the total number of segments in the VAC system. "3" represents the number of parallel LEDs in any set. It should be noted that the number of parallel LEDs in a set need not be constant. Some sets could feature 2 parallel LEDs while others utilize 3 or 4 LEDs in parallel.

Each set of one or more ECEs in a segment is also given by the single descriptor $M^{(+/-)}_{i2}$ where "i" extends from 1 to "n" with "n" being the total number of segments in the VAC system. "2" represents the number of parallel ECEs in any set. It should be noted that the number of parallel ECEs in a set need not be constant. Some sets could feature 2 parallel ECEs while others utilize 4 ECEs in parallel.

As indicated above, in a positive cycle where the bus 401 AC Black is positive with respect to the bus 403 AC White, current runs through $L^{(-)}_{13}$ to $M^{(+)}_{12}$ to $L^{(+)}_{n3}$ to $M^{(+)}_{n2}$. The LEDs $L^{(+)}_{13}$, any intervening $L^{(+)}_{i3}$, and $L^{(+)}_{n3}$ will illuminate. On the other hand, the LEDs $L^{(-)}_{13}$, any intervening $L^{(-)}_{i3}$, and $L^{(-)}_{n3}$ will be in reverse bias and will not illuminate, nor will they break down.

In a negative cycle, where the bus 403 AC White is positive with respect to the bus 401 AC Black, current runs through $L^{(-)}_{13}$ to $M^{(-)}_{12}$ to $L^{(-)}_{n3}$ to $M^{(-)}_{n2}$. The LEDs $L^{(-)}_{13}$, any intervening $L^{(-)}_{i3}$, and $L^{(-)}_{n3}$ will illuminate. On the other hand, the LEDs $L^{(+)}_{13}$, any intervening $L^{(+)}_{i3}$, and $L^{(+)}_{n3}$ will be in reverse bias and will not illuminate, nor will they break down. As with all the other lighting devices described herein, the alternate lighting extends the useful life of the lighting device.

It should be noted that the one of ordinary skill in the art would understand that any of the figures provided in this disclosure could be fabricated in a continuous roll, where each device is repeated.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A lighting device, comprising:
   a voltage source;
   a principal substrate;
   a conductive wiring formed on the principal substrate, and connected to the voltage source;
   a first light emitting diode (LED) and a second LED formed on the conductive wiring;
   a first electrical connection element (ECE) and a second ECE formed on the conductive wiring; and
   a transparent, conductive sheet material that is laminated onto the first and second LEDs and the first and second ECEs, wherein
   the first and second ECEs electrically connect the principal substrate to the transparent, conductive sheet material,
   the first and second LEDs are electrically connected in parallel and have opposite polarities, and
   a sheet resistance exists between the first ECE and the first LED and between the second ECE and the second LED.

2. The lighting device according to claim 1, wherein
   the voltage source may be a positive voltage source or a negative voltage source, and
   one of the first LED and the second LED illuminates and clamps the voltage to an amount that is less than a breakdown voltage of the non-illuminated one of the first LED and the second LED.

3. The lighting device according to claim 1, wherein
   the voltage source may be a positive voltage source or a negative voltage source, and
   the first LED, the first ECE, the second LED, and the second ECE comprise a first functional conductive pattern such that when the conductive wiring is connected with the voltage source only one of the first LED and the second LED illuminates and clamps the voltage, while the other of the first LED and the second LED does not illuminate and does not break down.

4. The lighting device according to claim 2, wherein the voltage source is an alternating current (AC) voltage source.

5. The lighting device according to claim 3, further comprising
one or more additional functional conductive patterns connected in series with the first functional conductive pattern, each additional functional conductive pattern comprising a first additional LED, a second additional LED, a first additional ECE, and a second additional ECE that are connected in a manner similar to the first LED, the second LED, the first ECE, and the second ECE, respectively, in the first functional conductive pattern, wherein
a sheet resistance exists in each additional functional conductive pattern between the first additional ECE and the first additional LED and between the second additional ECE and the second additional LED, and
one LED in each additional functional conductive pattern illuminates and clamps the voltage such that the other LED in the respective functional conductive pattern does not illuminate and does not break down.

6. The lighting device according to claim 5, wherein each ECE and LED between which a sheet resistance exists is electrically isolated from every other ECE and LED between which a sheet resistance exists.

7. A lighting device, comprising:
a voltage source;
a principal substrate;
a conductive wiring formed on the principal substrate, and connected to the voltage source;
a first set of plural, parallel light emitting diodes (LEDs) formed on the conductive wiring and a second set of plural, parallel LEDs formed on the conductive wiring;
a first set of one or more electrical connection elements (ECE) formed on the conductive wiring and a second set of one or more ECEs formed on a parallel conductive wiring; and
a transparent, conductive sheet material that is laminated onto all the LEDs in the first and second sets of plural, parallel LEDs and all the ECEs in the first and second sets of one or more ECEs, wherein
each ECE in the first set of one or more ECEs and the second set of one or more ECEs electrically connects the principal substrate to the transparent, conductive sheet material,
the first and second sets of LEDs are electrically connected in parallel, all the LEDs in the first set of plural, parallel LEDs having opposite polarities from all the LEDs in the second set of plural, parallel LEDs, and
a sheet resistance exists between each ECE in the first set of one or more ECEs and the first set of plural, parallel LEDs and between each ECE in the second set of one or more ECEs and the second set of plural, parallel LEDs.

8. The lighting device according to claim 7, wherein the voltage source may be a positive voltage source or a negative voltage source, and
one of one or more LEDs of the first set of plural, parallel LEDs and one or more LEDs of the second set of plural, parallel LEDs illuminates and clamps the voltage to an amount that is less than a breakdown voltage of the non-illuminated LEDs of the one or more LEDs of the first set of plural, parallel LEDs and one or more LEDs of the second set of plural.

9. The lighting device according to claim 7, wherein the voltage source may be a positive voltage source or a negative voltage source, and
the first set of plural, parallel LEDs, the second set of plural, parallel LEDs, the first set of one or more ECEs, and the second set of one or more ECEs comprise a first functional conductive pattern such that
when the conductive wiring is connected with the voltage source, one of one or more LEDs of the first set of plural, parallel LEDs and one or more of LEDs of the second set of plural, parallel LEDs illuminate and clamp the voltage while the other of the one or more LEDs of the first set of plural, parallel LEDs and the one or more LEDs of the second set of plural, parallel LEDs does not illuminate and does not break down.

10. The lighting device according to claim 8, wherein the voltage source is an alternating current (AC) voltage source.

11. The lighting device according to claim 9, further comprising:
one or more additional functional conductive patterns connected in series with the first functional conductive pattern, each additional functional conductive pattern comprising an additional first set of plural, parallel LEDs, an additional second set of plural parallel LEDs, an additional first set of one or more ECEs, and an additional second set of one or more ECEs that are connected in a similar manner to the first set of plural, parallel LEDs, the second set of plural LEDs, the first set of one or more ECEs, and the second set of one or more ECEs in the first functional conductive pattern, wherein
a sheet resistance is created in each additional function conductive pattern between each ECE in the additional first set of one or more ECEs and the additional first set of plural, parallel LEDs and between each ECE in the additional second set of one or more ECEs and the additional second set of plural, parallel LEDs, and
in each additional conductive pattern, one of one or more LEDs of the additional first set of plural, parallel LEDs and one or more LEDs of the additional second set of plural, parallel LEDs illuminate and clamp the voltage while the other of the one of one or more LEDs of the additional first set of plural, parallel LEDs and the one or more LEDs of the additional second set of plural, parallel LEDs does not illuminate and does not break down.

12. The lighting device according to claim 11, wherein each set of one or more ECEs and set of plural, parallel LEDs between which a sheet resistance exists is electrically isolated from every other set of one or more ECEs and set of plural, parallel LEDs between which a sheet resistance exists.

* * * * *